United States Patent [19]

Lee

[11] Patent Number: 5,712,723
[45] Date of Patent: Jan. 27, 1998

[54] SECOND HARMONIC GENERATOR

[75] Inventor: Jin-ho Lee, Seoul, Rep. of Korea

[73] Assignee: Samsung Electronics Co., Ltd., Kyungki-do, Rep. of Korea

[21] Appl. No.: 592,450

[22] Filed: Jan. 26, 1996

[30] Foreign Application Priority Data

Jan. 27, 1995 [KR] Rep. of Korea ............ 95-1565

[51] Int. Cl.$^6$ ........................... G02F 1/37; H01S 3/109
[52] U.S. Cl. ........................................ 359/328; 372/22
[58] Field of Search .......................... 359/326–332; 372/21, 22

[56] References Cited

U.S. PATENT DOCUMENTS

| | | | |
|---|---|---|---|
| 3,858,056 | 12/1974 | Melamed et al. | 359/326 |
| 4,913,533 | 4/1990 | Kafka et al. | 359/328 |
| 5,093,832 | 3/1992 | Bethune et al. | 372/21 |
| 5,253,259 | 10/1993 | Yamamoto et al. | 372/22 |
| 5,495,489 | 2/1996 | Lee et al. | 372/34 |
| 5,521,375 | 5/1996 | Jang | 359/328 X |

*Primary Examiner*—John D. Lee
*Attorney, Agent, or Firm*—Leydig, Voit & Mayer, Ltd.

[57] ABSTRACT

A second harmonic generator includes a laser diode mount, a laser diode on the mount for producing pumping light, a resonator for generating second harmonic light from the pumping light output from the laser diode, a lock connecting the resonator and the laser diode mount, a thermal controller including a thermoelectric cooling device for controlling the temperature of the resonator, a housing housing the resonator and coupled to the laser diode mount, a beam splitter for reflecting part of the second harmonic light emitted from the resonator, and a photodetector for detecting light reflected from the beam splitter. The thermoelectric cooling device is interposed between the housing and resonator so that the resonator and the housing are thermally connected. The second harmonic generator separates a thermally unrelated element from a thermal control path to reduce the heat control burden. Since the path of heat flow is only from the resonator to the housing, temperature control of the resonator is accomplished rapidly and precisely.

25 Claims, 3 Drawing Sheets

SECOND HARMONIC GENERATOR

BACKGROUND OF THE INVENTION

The present invention relates to a second harmonic generator and, more particularly, to a second harmonic generator that generates a stable second harmonic with precise temperature control.

Optical reading and writing technology for audio and video disk devices uses light having a wavelength shorter than 800 nm, the wavelength produced by a conventional semiconductor diode. Thus, in response to that need, research into a second harmonic generator (SHG) for generating a blue-green laser light beam has been actively pursued. The principal SHG apparatus includes an internal resonator in which a gain medium such as Nd:YAG or Nd:glass and a non-linear birefringent crystalline material, such as KTP ($K.TiO.PO_4$), are located with the resonator that is optically confined by two mirrors. However, this apparatus has a drawback in that a temperature change of the gain medium and the non-linear birefringent crystalline element varies the phase of the fundamental wave, so the second harmonic output is unstable. Since the gain medium material highly absorbs pumping light having a wavelength of 809 nm, and the absorption bandwidth is only several nanometers, it is necessary to strictly control the operating temperature of the semiconductor diode that produces the pumping light.

FIG. 1 is a schematic cross-sectional view of a package structure of an SHG apparatus according to the prior art. The second harmonic generator is divided externally into a laser diode mount 2 and a resonator housing 3. The laser diode mount 2 and the resonator housing 3 are connected mutually in the longitudinal direction and each houses optical parts.

The laser diode mount 2 has a cylindrical large diameter portion 21 and small diameter portion 22 which have the same axis. A laser diode 11 is mounted in the large diameter portion 21, and a focusing lens group 12 is incorporated in the small diameter portion 22. A cooling plate 1 for cooling the laser diode 11 is installed at the rear of the laser diode 11. A focusing lens mount 12 is fixed in the center of the small diameter portion 22 with adjusting screws 23 so that position adjustment is possible.

The resonator housing 3 also has a large diameter portion 31 and a small diameter portion 32. Since the large diameter portion 31 is larger that the small diameter portion 32, a space is provided in which a locking nut 4 connecting the small diameter portion 22 of the laser diode mount 2 to one end of a resonator 5 and to the adjusting screws 23 is located. A groove of a predetermined size is provided on the outside of housing 3 and a thermoelectric cooling element 16 is installed in the groove. A cover 10 with an aperture 8 through which second harmonic light is output is coupled to the small diameter portion 32. The resonator 5 is coupled to the small diameter portion 22 of the laser mount 2 by the locking nut 4, which comprises a first member 51 incorporating an input mirror 13, a gain medium 14, and a polarizer 15, and a non-linear birefringent element mount 7 incorporating a non-linear birefringent element 18 and a thermoelectric cooling element 17, on one side of which an output mirror 19 is fixed. The resonator 5 is lengthwise coupled to the first member 51, in which a cylindrical second member 52 having an end portion 54 including an aperture 53 for output of the second harmonic light, is located opposite the end connected to the first member 51. The second member 52 accommodates a beam splitter 61 positioned adjacent to the end portion 54, on a beam splitter mount 9, a photodetector 60 located under the beam splitter mount 9, and a photodetector assembly 62 on which the photodetector 60 is mounted.

Since elements not requiring temperature adjustment, such as the beam splitter 61 and the photodetector 60, are located inside the second member 52 of the resonator 5, the prior art second harmonic generator has poor efficiency in precise temperature adjustment. Also, since the thermoelectric cooling element 16 is provided only on one side of the resonator housing 3, the flow of heat through other portions of the resonator housing cannot be completely controlled. Finally, since the laser diode mount 2 and the first member 51 of the resonator are connected thermally, it is difficult to control heat flow between the laser diode 11 and the resonator 5.

SUMMARY OF THE INVENTION

It is an object of the present invention to provide a second harmonic generator that can control temperature precisely and effectively by limiting a heat flow path.

It is another object of the present invention to provide a second harmonic generator in which a stable output of second harmonic light is achieved.

To accomplish these objects, a second harmonic generator according to the present invention includes a laser diode mount; a laser diode mounted on the mount for producing pumping light; a resonator for generating second harmonic light from the pumping light output by the laser diode; locking means connecting the resonator to the laser diode mount; thermal control means including a thermoelectric cooling device for controlling the temperature of the resonator; a housing housing the resonator and coupled to the laser diode mount, the thermoelectric cooling device being interposed between and thermally connecting the housing to the resonator; a beam splitter for reflecting part of the second harmonic light emitted from the resonator; and a photodetector for detecting the light reflected from the beam splitter.

It is preferable that the locking means be formed of a thermally insulating material to thermally insulate the resonator from the laser diode mount.

It is more preferable that the locking means comprises a locking nut, a first end of which threadedly engages the laser diode mount and a gap adjusting nut for adjusting the gap between a second end of the locking nut and the resonator, and the resonator comprises a threaded portion threadedly engaging the gap adjusting nut.

It is still more preferable that the housing comprises an end having an aperture through which second harmonic light is output. The beam splitter and the photodetector are mounted on the end of the housing.

It is also preferable that two thermoelectric cooling elements be positioned on two opposing surfaces of the resonator and that a thermal insulator be positioned on two other opposing surfaces of the resonator where the thermoelectric cooling elements are not present.

Also, it is further preferable that the resonator include a thermally conducting cylinder thermally connected to the thermoelectric cooling element, that the thermally conducting cylinder be coupled to the locking means, and that the locking means be thermally insulating so that the thermal conductor and the laser diode mount are thermally insulated from each other.

BRIEF DESCRIPTION OF THE DRAWINGS

The above objects and advantages of the present invention will become more apparent by describing in detail a preferred embodiment with reference to the attached drawings in which.

DETAILED DESCRIPTION OF THE INVENTION

Figure 1:
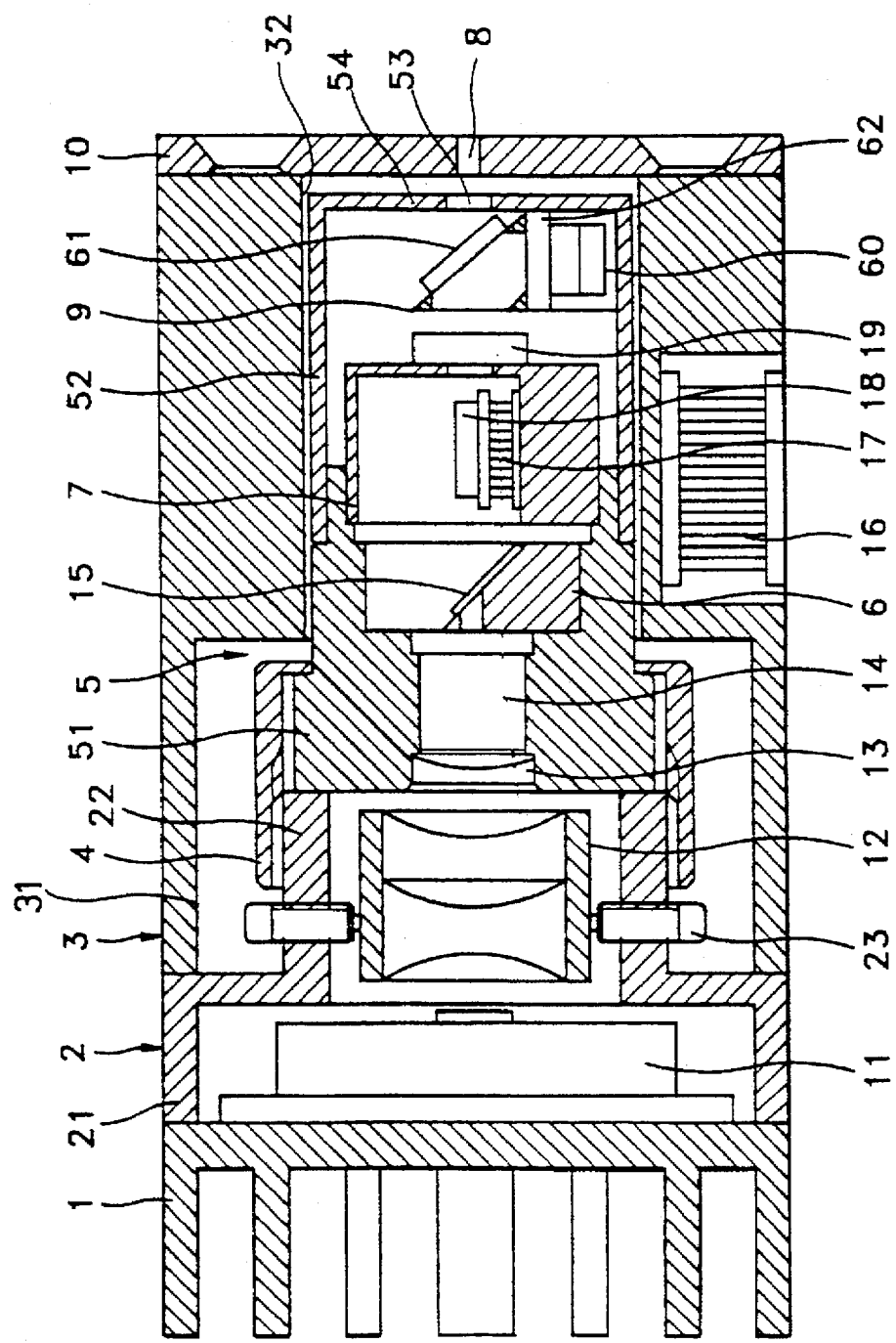
FIG. 1 is a schematic cross-sectional view of a prior art second harmonic generator.
Figure 2:
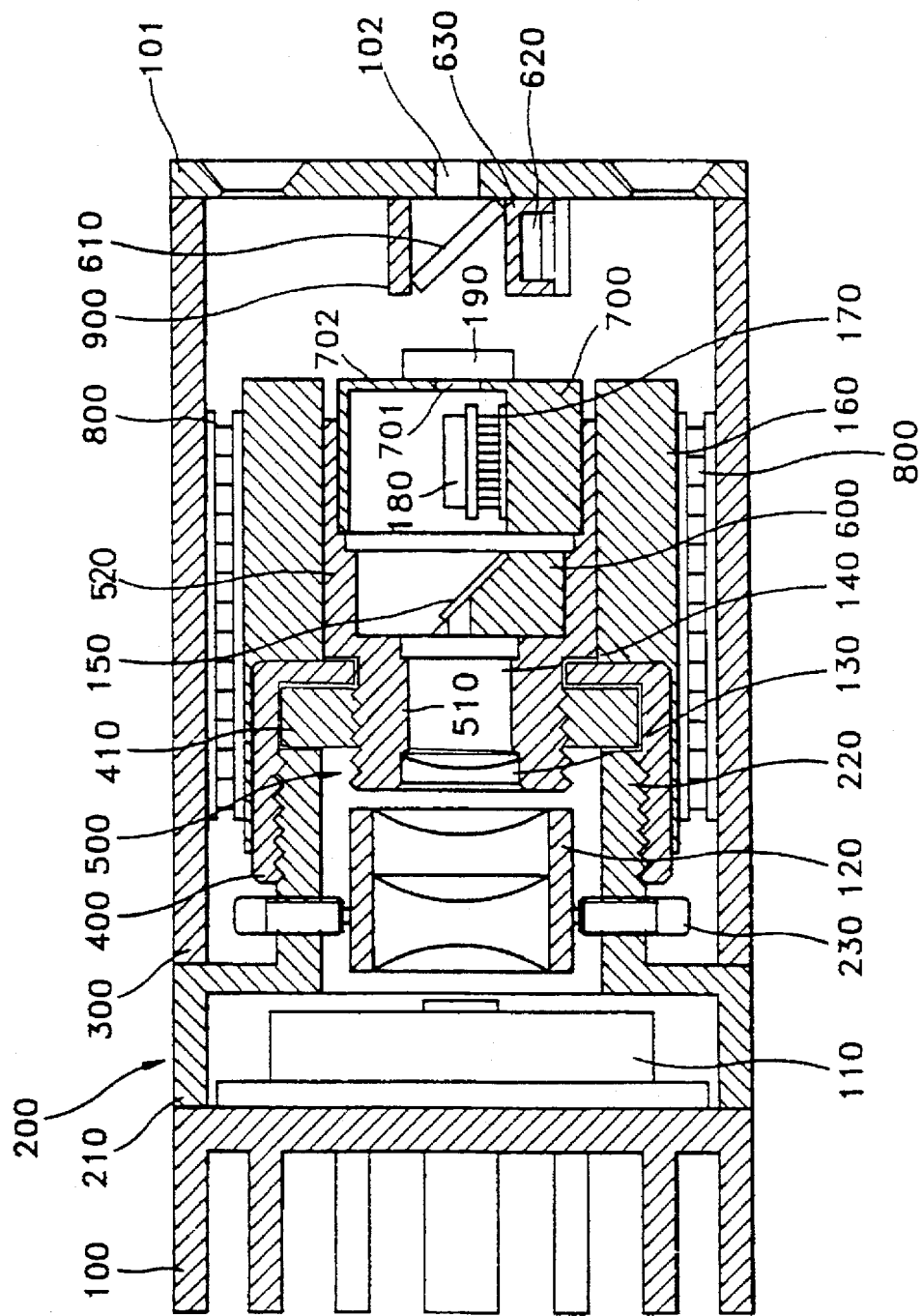
FIG. 2 is a schematic cross-sectional view of an embodiment of a second harmonic generator according to the present invention.

With reference to FIG. 2, a second harmonic generator according to the present invention is divided into a laser diode mount 200 and a resonator housing 300. The laser diode mount 200 and resonator housing 300 are mutually connected to each other along a common axis and each houses optical parts.

The laser diode mount 200 has a cylindrical large diameter portion 210 and a cylindrical small diameter portion 220 having a common axis. A laser diode 110 is mounted in the large diameter portion 210, and a focusing lens group 120 is incorporated in the small diameter portion 220. A cooling plate 100 for cooling the laser diode 110 is located at the rear of the laser diode 110. The focusing lens group 120 is fixed in the center of the small diameter portion 220 with adjusting screws 230 so that position adjustment is possible.

The resonator housing 300 is a simple hollow body including an end 101 containing an aperture 102 at one end of the resonator housing. A beam splitter 610 tilted a predetermined angle with regard to the axis of the aperture 102, a photodetector 620 adjacent to the reflecting surface of the beam splitter 610, and a mount 630 for mounting the photodetector 620 are mounted on the inner surface of the end 101. The beam splitter 610 is mounted on a beam splitter mount 900.

The resonator 500 has a tubular, externally threaded portion 510 opposing the focusing lens group 120 and a hollow body 520 facing the beam splitter 610. An input mirror 130 and a gain medium 140 are positioned inside the threaded portion 510 on the same axis. A polarization element 150 forming a predetermined angle with respect to a polarization element mount 600 and a non-linear birefringent element 180 mounted on a thermoelectric cooling element 170 located in a non-linear birefringent element mount 700 are all located within the body 520. The non-linear birefringent element mount 700 is a hollow body having a portion 702 including an aperture 701 on which an input mirror 190 is located and which is disposed and mounted inside the body 520.

The resonator 500 is connected to the small diameter portion 220 of the laser diode mount 200 by a thermal conductor 160 surrounding the body 520 of the resonator 500 and a locking nut 400 engaging one end of the thermal conductor 160. Thermoelectric cooling elements 800 are disposed on the surface of the thermal conductor 160. The cooling surfaces of the thermoelectric cooling elements 800 are in contact with the thermal conductor 160, and the heating surface of the thermoelectric cooling elements 800 are in contact with the inner surface of the housing 300.

Figure 3:
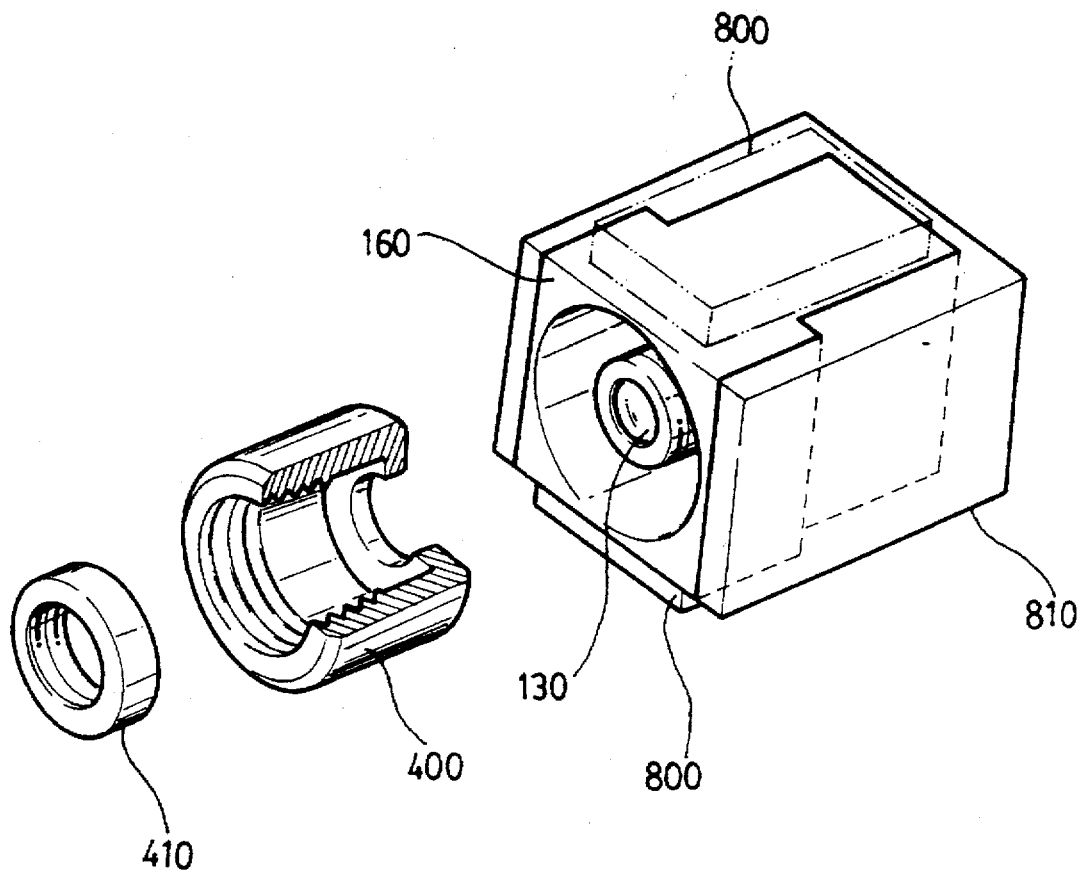
FIG. 3 is an exploded perspective view of the resonator in an embodiment of a second harmonic generator according to the present invention.
Figure 4:
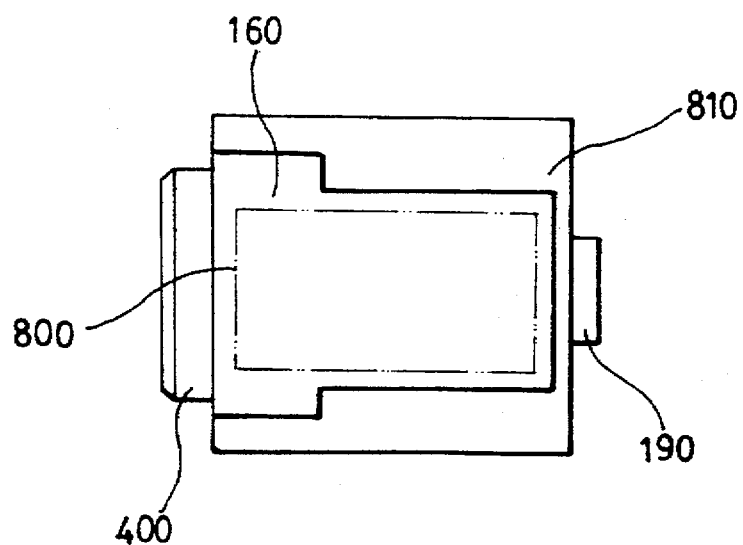
FIG. 4 is a plan view of the resonator in the second harmonic generator embodiment according to the present invention that is shown in FIG. 3.

FIGS. 3 and 4 are a perspective view and a plan view respectively indicating the relationship of the resonator 500, the thermoelectric cooling elements 800 mounted on two opposing surfaces of resonator 500, and a thermal insulator 810 mounted on two opposing surfaces of the resonator 500. The resonator 500, the thermoelectric cooling elements 800, and the thermal insulator 810 are installed in the housing 300. The thermal insulator 810 is U-shaped and surrounds a part of the resonator 500 not contacted by the thermoelectric cooling elements 800, that is to say, the lateral sides of the thermal conductor 160. The thermal insulator 810 may be any material with a suitably low thermal conductivity and elasticity for maintaining contact with the resonator 500. An example of such a material is tetrafluoroethylene, sold under the trademark TEFLON by E. I. DuPont de Nemours of Wilmington, Del. Locking nut 400 coupled to the threaded portion of resonator 500 couples the resonator 500 to the laser diode mount 200. A first end of the locking nut 400 receives the threaded portion of the resonator 500 and engages an adjusting nut 410 for adjusting a gap between the resonator 500 and the focusing lens group 120. A second end of the locking nut 400 threadedly engages the small diameter portion 220 of the laser diode mount 200.

While the adjusting nut 410 is used for adjusting the gap between the resonator 500 and the focusing lens group 120, the adjusting nut 410 is also compressed against the end of the small diameter portion 220 of the laser diode mount 200 by the locking nut 400. In the above structure, the locking nut 400 and the adjusting nut 410 are made of thermally insulating materials, for example, generally available engineering plastics, such as cast nylon monomer, 6-nylon (a combination of 6.6 nylon and polyamide), polyacetal, polyethylene, ultra-high molecular weight polyethylene, tetrafluoroethylene, urethane, polycarbonate, and polyvinyl chloride.

The beam splitter 610 and the photodetector 620, which are thermally unrelated elements, are installed on the end 101 of the housing 300 and are excluded from a heat control path, reducing the heat control burden. The heat control path is limited to the up and down directions of the resonator, as shown in FIG. 2, so that effective heat flow control is possible. By contrast, in the prior art structure in which a thermoelectric cooling element is located only on one side of the resonator and heat flows in other directions, control of the heat flow is difficult or impossible. In the embodiment of FIG. 2, since the resonator 500 and the laser diode mount 200 are thermally insulated by the locking nut 400 and the adjusting nut 410, and the thermal insulator 810 is provided between the housing 300 and the heat conductor 160, thermal, i.e., temperature, control of the resonator is readily achieved using the thermoelectric cooling elements 800.

Since the thermoelectric cooling elements 800 control the temperature of only the resonator 500, the thermal control burden is small because the heat capacity, i.e., thermal mass, to be controlled is reduced so that temperature control and changes can be achieved rapidly.

According to the result of an experiment on an embodiment of the present invention, when used for 24 hours at room temperature, second harmonic output light had a frequency deviation less than ±1%. When the external temperature was in the range from 10° C. to 35° C., second harmonic output light had a frequency deviation of ±2%.

I claim:

1. A second harmonic generator comprising:

a laser diode mount;

a laser diode disposed on said laser diode mount for generating pumping light;

a resonator for generating second harmonic light from the pumping laser light output by said laser diode, said resonator including spaced apart input mirrors and a gain medium, a polarization element, and a birefringent element serially arranged between said input and output mirrors, and a first thermoelectric cooling element contacting said birefringent element;

locking means connecting said resonator to said laser diode mount;

thermal control means including a thermoelectric cooling device for controlling the temperature of said resonator;

a housing housing said resonator and coupled to said laser diode mount, said thermoelectric cooling device being interposed between and thermally connecting said housing to said resonator;

a beam splitter for reflecting part of the second harmonic light emitted from said resonator; and a photodetector for detecting the light reflected from said beam splitter.

2. The second harmonic generator according to claim 1 wherein said housing includes an end having an aperture through which the second harmonic light is output and wherein said beam splitter and said photodetector are mounted on said end of said housing.

3. The second harmonic generator according to claim 2 wherein said thermoelectric cooling device includes second and third thermoelectric cooling elements mounted on opposing surfaces of said resonator.

4. The second harmonic generator according to claim 3 including a thermal insulator on surface of said resonator where said second and third thermoelectric cooling elements are not present.

5. The second harmonic generator according to claim 1 wherein said locking means is made of a thermally insulating material for thermally insulating said resonator from said laser diode mount.

6. The second harmonic generator according to claim 5 wherein said housing includes an end having an aperture through which the second harmonic light is output and wherein said beam splitter and said photodetector are mounted on said end of said housing.

7. The second harmonic generator according to claim 5 wherein said locking means comprises:

a locking nut having a first end threadedly engaging said laser diode mount; and a gap adjusting nut on a second end of said locking nut, wherein said resonator includes a threaded portion threadedly engaging said gap adjusting nut.

8. The second harmonic generator according to claim 7 wherein said housing includes an end having an aperture through which the second harmonic light is output and wherein said beam splitter and said photodetector are mounted on said end of said housing.

9. The second harmonic generator according to claim 7 including two thermoelectric cooling elements mounted on opposing surfaces of said resonators.

10. The second harmonic generator according to claim 5 wherein said thermoelectric cooling device includes second and third thermoelectric cooling elements mounted on opposing surfaces of said resonator.

11. The second harmonic generator according to claim 10 including a thermal insulator on surfaces of said resonator where said second and third thermoelectric cooling elements are not present.

12. The second harmonic generator according to claim 1 wherein said thermoelectric cooling device includes second and third thermoelectric cooling elements mounted on opposing surfaces of said resonator.

13. The second harmonic generator according to claim 12 including a thermal insulator on surfaces of said resonator where said second and third thermoelectric cooling elements are not present.

14. The second harmonic generator according to claim 1 wherein said resonator includes a thermally conducting cylinder thermally connected to said thermoelectric cooling device.

15. The second harmonic generator according to claim 15 wherein said thermally conducting cylinder is coupled to said locking means, and said locking means is made of a thermally insulating material thermally insulating said thermally conducting cylinder from said laser diode mount.

16. The second harmonic generator according to claim 15 wherein said locking means comprises a locking nut having a first end threadedly engaging said laser diode mount and a gap adjusting nut coupling a second end of said locking nut to said resonator and wherein said resonator includes a threaded portion threadedly engaging said gap adjusting nut.

17. A second harmonic generator comprising:

a laser diode mount;

a laser diode disposed on said laser diode mount for generating pumping light;

a resonator for generating second harmonic light from the pumping laser light output by said laser diode;

locking means connecting said resonator to said laser diode mount, said locking means being made of a thermally insulating material thermally insulating said resonator from said laser diode mount;

thermal control means including a thermoelectric cooling device for controlling the temperature of said resonator;

a housing housing said resonator and coupled to said laser diode mount, said thermoelectric cooling device being interposed between and thermally connecting said housing to said resonator;

a beam splitter for reflecting part of the second harmonic light emitted from said resonator; and a photodetector for detecting the light reflected from said beam splitter.

18. The second harmonic generator according to claim 17 wherein said resonator includes a thermally conducting cylinder thermally connected to said thermoelectric cooling device.

19. The second harmonic generator according to claim 18 wherein said thermally conducting cylinder is coupled to said locking means.

20. The second harmonic generator according to claim 19 wherein said locking means comprises a locking nut having a first end threadedly engaging said laser diode mount and a gap adjusting nut coupling a second end of said locking nut to said resonator and wherein said resonator includes a threaded portion threadedly engaging said gap adjusting nut.

21. A second harmonic generator comprising:

a laser diode mount;

a laser diode disposed on said laser diode mount for generating pumping light;

a resonator for generating second harmonic light from the pumping laser light output by said laser diode;

locking means connecting said resonator to said laser diode mount;

thermal control means including two thermoelectric cooling elements mounted on opposing surfaces of said resonator for controlling the temperature of said resonator;

a housing housing said resonator and coupled to said laser diode mount, said two thermoelectric cooling elements being interposed between and thermally connecting said housing to said resonator;

a beam splitter for reflecting part of the second harmonic light emitted from said resonator; and a photodetector for detecting the light reflected from said beam splitter.

22. The second harmonic generator according to claim 21 including a thermal insulator on surfaces of said resonator where said thermoelectric cooling elements are not present.

23. The second harmonic generator according to claim 21 wherein said resonator includes a thermally conducting cylinder thermally connected to said two thermoelectric cooling elements.

24. The second harmonic generator according to claim 23 wherein said thermally conducting cylinder is coupled to said locking means, and said locking means is made of a thermally insulating material thermally insulating said thermally conducting cylinder from said laser diode mount.

25. The second harmonic generator according to claim 24 wherein said locking means comprises a locking nut having a first end threadedly engaging said laser diode mount and a gap adjusting nut coupling a second end of said locking nut to said resonator and wherein said resonator includes a threaded portion threadedly engaging said gap adjusting nut.

\* \* \* \* \*